(12) United States Patent
Singh et al.

(10) Patent No.: US 6,417,084 B1
(45) Date of Patent: Jul. 9, 2002

(54) T-GATE FORMATION USING A MODIFIED CONVENTIONAL POLY PROCESS

(75) Inventors: Bhanwar Singh, Morgan Hill; Marina Plat; Ramkumar Subramanian, both of San Jose; Christopher F. Lyons, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 84 days.

(21) Appl. No.: 09/620,300

(22) Filed: Jul. 20, 2000

(51) Int. Cl.[7] .......................... H01L 21/3205
(52) U.S. Cl. ............... 438/585; 438/586; 438/595; 438/182
(58) Field of Search ................. 438/585, 586, 438/595, 182

(56) References Cited

U.S. PATENT DOCUMENTS

| | | |
|---|---|---|
| 4,980,316 A | 12/1990 | Huebner |
| 5,155,053 A | 10/1992 | Atkinson |
| 5,677,089 A | 10/1997 | Park et al. |
| 5,930,610 A | 7/1999 | Lee |
| 6,077,761 A * | 6/2000 | Chen et al. ............... 438/574 |
| 6,255,202 B1 * | 7/2001 | Lyons et al. .............. 438/585 |
| 6,270,929 B1 * | 8/2001 | Lyons et al. .............. 430/5 |
| 6,306,710 B1 * | 10/2001 | Long et al. ............... 438/279 |
| 6,313,019 B1 * | 11/2001 | Subramanian et al. ...... 438/585 |
| 6,319,802 B1 * | 11/2001 | Subramanian et al. ...... 438/585 |
| 2001/0009784 A1 * | 7/2001 | Ma et al. ................. 438/197 |

* cited by examiner

Primary Examiner—John F. Niebling
Assistant Examiner—Lynne Gurley
(74) Attorney, Agent, or Firm—Amin & Turocy, LLP

(57) ABSTRACT

A method is provided for fabricating a T-gate structure. A structure is provided that has a silicon layer having a gate oxide layer, a polysilicon layer over the gate oxide layer, and an ARC layer over the polysilicon layer. A gate structure is formed by removing the ARC layer and a portion of the polysilicon layer around a gate region. Spacers are then formed around the gate structure. Undercut regions are formed in the gate structure by performing an isotropic etch to provide the gate structure with a base region and a contact region. The base region has a width smaller than the contact region.

19 Claims, 4 Drawing Sheets

T-GATE FORMATION USING A MODIFIED CONVENTIONAL POLY PROCESS

TECHNICAL FIELD

The present invention generally relates to semiconductor processing, and in particular to a method for forming a gate structure with a contact area wider than a base area.

BACKGROUND OF THE INVENTION

Historically, gate structures having a base area with a width that is smaller than the gate contact area (e.g., F-gate and Y-gate structures) have been advantageous in several technologies. For example, MESFET, HEMT (variant of gallium arsenide field effect transistor technology) mainly used in satellite broadcasting receivers, high speed logic circuits and power modules have employed gate structures with bases smaller than the contact area. These types of devices are required in field effect transistors for operation in ultra-high frequency ranges. The advantage of employing a gate structure with a shorter gate length is that the channel of the gate is reduced resulting in an increased in speed and a decrease in power consumption. Reducing the distance over which the gate's field effect control of the electrons in the channel reduces the parasitic resistances and capacitances that limit device speed. A shorter gate length decreases the transmit time for carriers in the channel but also increases the series resistance of the gate electrode itself, slowing down the device and degrading the frequency characteristics of the device. Providing a gate structure with a smaller base than its contact area decreases the gate channel while providing a low gate series resistance due to the wider contact area and, thus, improving the devices drive current capability and performance.

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Recent advances in CMOS transistor architecture make use of the T-gate or Y-gate structures where the polysilicon gate electrode is narrowed in the gate regions and wider on top of the gate. This is due to the ever increasing demand for scaling down semiconductor devices and scaling down power consumption requirements. However, the current methods for forming a gate structure with a contact region wider than its base suffers from shortcomings. For example, the etch process which narrows the base of the structure are known to be difficult to control especially with local pattern density. This can lead to variation in the gate width and asymmetric implant profiles. Another problem is related to manufacturing controls. The "re-entrant" or overhung profile prevents direct measurement of the critical gate length.

In view of the above, there is an unmet need for improvements in methodologies for formation of gate structures with contact areas that are wider than the base area.

SUMMARY OF THE INVENTION

The present invention employs a methodology for forming a T-gate structure. The methodology comprises forming a gate oxide over a silicon layer, a polysilicon layer over the gate oxide layer and an ARC layer over the polysilicon layer. A gate structure is formed by anisotropically etching the ARC layer and portions of the polysilicon layer around the gate structure. The etching of the polysilicon layer is not a complete etch and stops at a certain depth. Oxide is then formed over the polysilicon and spacers are formed outside the gate structure, for example, by performing a vertical plasma etch, thus, removing the remaining portions of the oxide. Employing the oxide as a protective hard mask, the remaining poly is etched aggressively using an isotropic etch to form undercut region under the gate structure. During the isotropic etch the polysilicon is overetched to form the undercut regions and remove the polysilicon outside the gate structure. A second pair of spacers are formed along the sidewalls of the gate structure to protect the gate structure. This is accomplished by providing an additional oxide layer and by removing the oxide outside the gate structure similar to the formation of the first spacers.

One aspect of the invention relates to a method for fabricating a T-gate structure. A structure is provided that has a silicon layer having a gate oxide layer, and a polysilicon layer over the gate oxide layer. A gate structure is formed by removing a portion of the polysilicon layer around a gate region. Undercut regions are formed in the gate structure to provide the gate structure with a base region and a contact region. The base region has a width smaller than the contact region.

Another aspect of the present invention relates to another method for fabricating a T-gate structure. A structure is provided that has a silicon layer having a gate oxide layer, a polysilicon layer over the gate oxide layer, and an ARC layer over the polysilicon layer. A gate structure is formed by removing the ARC layer and a portion of the polysilicon layer around a gate region. Spacers are then formed around the gate structure. Undercut regions are formed in the gate structure by performing an isotropic etch to provide the gate structure with a base region and a contact region. The base region has a width smaller than the contact region.

Yet another aspect of the present invention provides for yet another method for fabricating a T-gate structure. A structure is provided that has a silicon layer having a gate oxide layer, a polysilicon layer over the gate oxide layer, and an ARC layer over the polysilicon layer. A gate structure is formed by removing the ARC layer and a portion of the polysilicon layer around a gate region. Spacers are then formed around the gate structure. Undercut regions are formed in the gate structure by performing an Isotropic etch to provide the gate structure with a base region and a contact region. The base region has a width smaller than the contact region. The isotropic etch is performed by using a MERIE method with reactant gases of $CL_2$ (30–100 sccm) and HBr (30–100 sccm) at a power level within the range of about 300–700 W, and pressure within the range of about 10–250 mT. A second pair of spacers is then formed around the gate structure.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
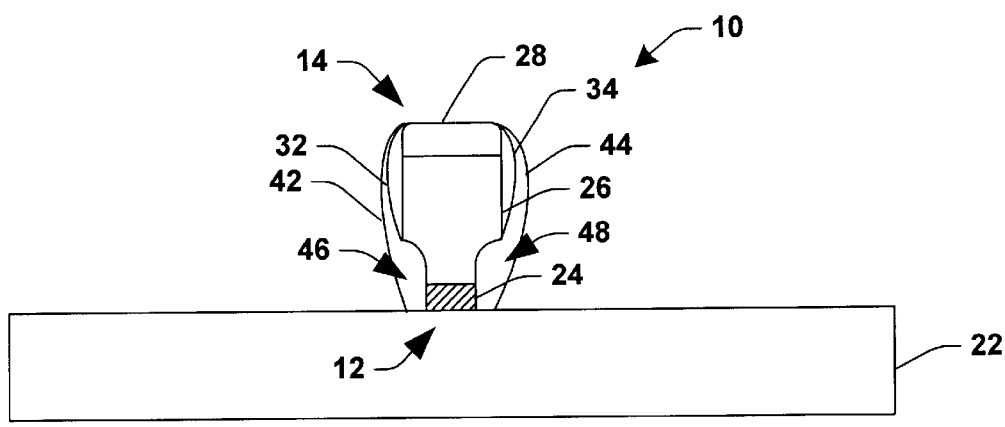
FIG. 1 is a schematic cross-sectional illustration of a T-gate structure overlying a silicon layer in accordance with one aspect of the invention.

The present invention will now be described with reference to the drawings, wherein like reference numerals are used to refer to like elements throughout. The present invention is described with reference to a method for forming a T-gate structure over a silicon layer to form a semiconductor with more speed and less power consumption. It is to be understood that the description of the various aspects of the present invention are merely illustrative and that they should not be taken in a limiting sense.

FIG. 1 illustrates a T-gate structure 10 according to the present invention. The T-gate structure 10 resides over a silicon layer 22 and includes a base portion 12 and a top or contact portion 14. The T-gate structure 10 includes undercut regions 46 and 48 differentiate the base portion 12 from the contact portion 14. The base portion 12 has a gate oxide layer 24 and an a sloping portion formed from a silicon layer 26. The top or contact portion 14 is the gate contact area and can be comprised of polysilicon, germanium, amorphous silicon, metals or the like. An arc layer 28 remains on the top of the gate contact area but will be removed if the arc layer 28 is of a nonconducting material. A first pair of spacers 32 and 34 are formed on the sidewalls of the contact portion 14 and a second pair of spacers 42 and 44 are formed on the side walls of the T-gate structure 10. The base portion 12 has a width that is smaller than the top portion 14.

Figure 2:
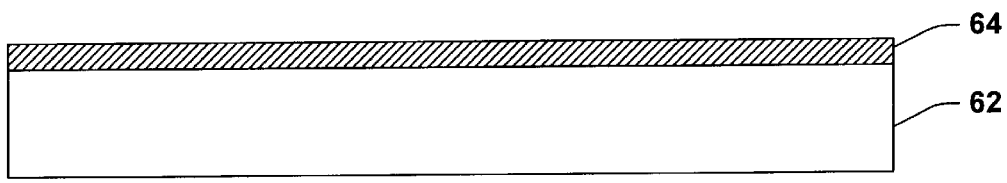
FIG. 2 is a schematic cross-sectional illustration of the silicon layer having a gate oxide layer in accordance with one aspect of the present invention.
Figure 3:
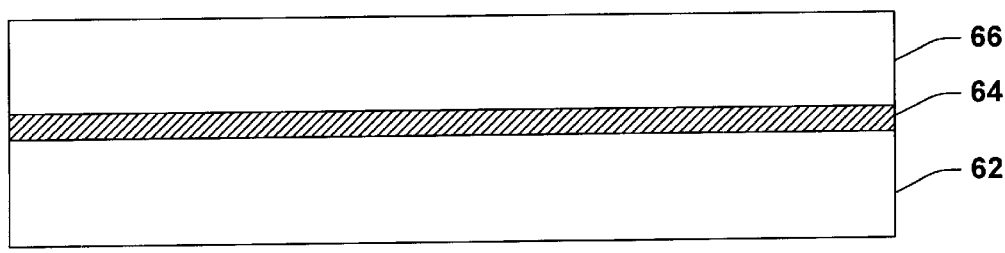
FIG. 3 is a schematic cross-sectional illustration of the structure of FIG. 2 having a polysilicon layer over the gate oxide layer in accordance with one aspect of the present invention.
Figure 4:
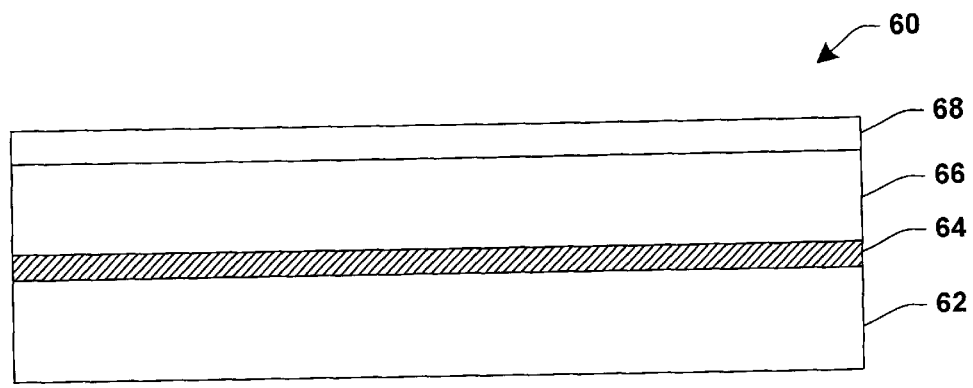
FIG. 4 is a schematic cross-sectional illustration of the structure of FIG. 3 having a antireflective layer over the polysilicon layer in accordance with one aspect of the present invention.
Figure 5:
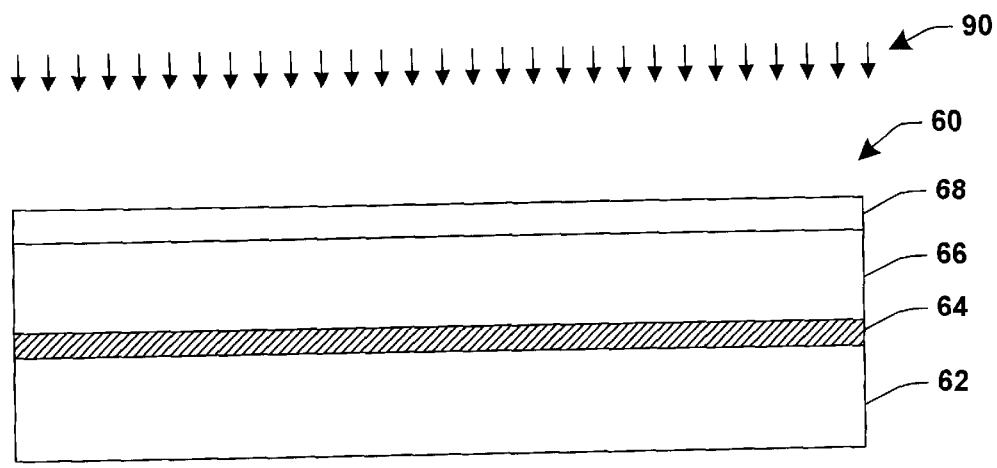
FIG. 5 is a schematic cross-sectional illustration of the structure of FIG. 4 undergoing an etching step in accordance with one aspect of the present invention.

FIGS. 2–14 illustrate a methodology of fabricating the T-gate structure of the present invention. FIG. 2 illustrates a structure 60 having a gate oxide layer 64 disposed over a silicon layer 62. The thin gate oxide material 64 is formed to have a thickness within the range of about 10–20 Å. Preferably, the thin gate oxide material 64 includes $SiO_2$ which has a substantially low dielectric constant. However, it is to be appreciated that any suitable material (e.g., $Si_3N_4$) for carrying out the present invention may be employed and is intended to fall within the scope of the present invention. A polysilicon material layer 66 is formed over the gate oxide material 64, as illustrated in FIG. 3. Preferably, the polysilicon material layer 66 is doped prior to the formation of the polysilicon material layer 66 over the gate oxide material 64.

An antireflective coating (ARC) layer 68 is deposited over the polysilicon material layer 66. The ARC layer 68 mitigates effects of high optical transparency of underlying layers, minimizes the effects of significant variations in reflectivities of layers and features in underlying layers, and mitigates the effects of significant variations in thickness of the underlying layers. The ARC layer 68 mitigates deleterious affects on the photoresist patterning process. The ARC layer 68 may be formed of silicon oxynitride (SiON), silicon rich nitride (SiN), titanium nitride (TiN) or another material having optical properties appropriate for functioning as an ARC layer. Any suitable technique for forming the ARC layer 68 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques to a thickness suitable for serving as a hard mask for a selective etch of the underlying layers. The layers and features under the underlying ARC layer 68 include any material or device used in semiconductor structures and thus have diverse reflectivities. For example, typically metal layers have reflectivities of about 80% or more, polysilicons have reflectivities of about 50% and metal nitrides have reflectivities of about 30%. In one embodiment, the layers and/or features under the arc layer have at least two different reflectivities that vary by more than about 20% at the exposure wavelength.

In one aspect of the invention, the combined thickness of the gate oxide layer 64, the polysilicon layer 66 and the ARC layer 68 have a thickness of about 500 Å–3,000 Å, however, it is to be appreciated that the thickness thereof may be of any dimension suitable for carrying out the present invention. Accordingly, the thickness of the gate oxide layer 64 can be formed to have a thickness within the range of 10 Å to 1,000 Å, the polysilicon layer 66 can be formed to have a thickness within the range of 200 Å to 2,500 Å and the ARC layer 68 can be formed to have a thickness within the range of 100 Å to 1,500 Å.

Figure 6:
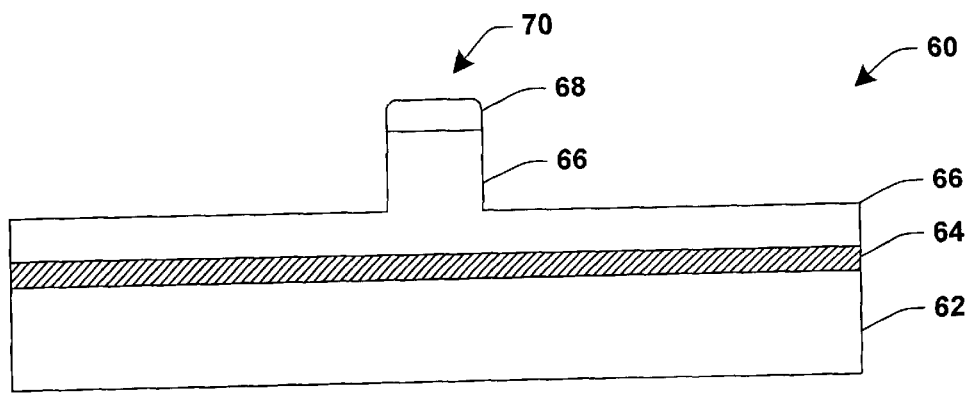
FIG. 6 is a schematic cross-sectional illustration of the structure of FIG. 5 after antireflective layer and a portion of the polysilicon layer around a gate region to form a gate structure in accordance with one aspect of the present invention.

An etch step 90 (e.g., anisotropic reactive ion etching (RIE)) (FIG. 5) is performed to remove portions of the ARC layer 68 and the polysilicon layer 66 to leave a gate structure 70 (FIG. 6). A photoresist layer may first be patterned (not shown) and used as a mask for selectively etching the ARC layer 68 and the polysilicon layer 66 to provide the gate structure 70. However, the ARC layer 68 may be etched prior to the etching of the polysilicon layer 66 and be employed as a hard mask for etching the polysilicon layer 66. Preferably, a selective etch technique is used to etch the material of the photoresist layer at a relatively greater rate as compared to the rate that the material of the ARC layer 68 if a photoresist layer is employed. Additionaly, a selective etch technique is used to etch the material of the ARC layer 68 at a relatively greater rate as compared to the rate that the material of the polysilicon layer 66 if an ARC layer hard mask is to be formed. Any suitable etch technique may be used to etch the ARC layer 68 and the polysilicon layer 66. For example, the ARC layer 68 and the polysilicon layer 66 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist layer to thereby create the gate structure 70. Preferably, a selective etch technique is used to etch the material of the ARC layer 68 and the polysilicon layer 66 at a relatively greater rate as compared to the rate that the material of the patterned photoresist. Importantly, the polysilicon layer 66 is partially etched so that a portion of the polysilicon layer 66 remains over the underlying gate oxide layer 64.

Figure 7:
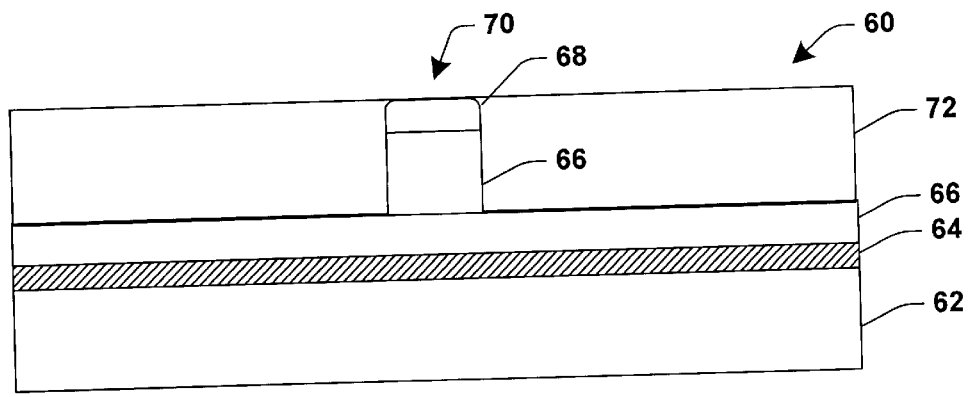
FIG. 7 is a schematic cross-sectional illustration of the structure of FIG. 6 after an oxide layer is deposited over the polysilicon layer in accordance with one aspect of the present invention.
Figure 8:
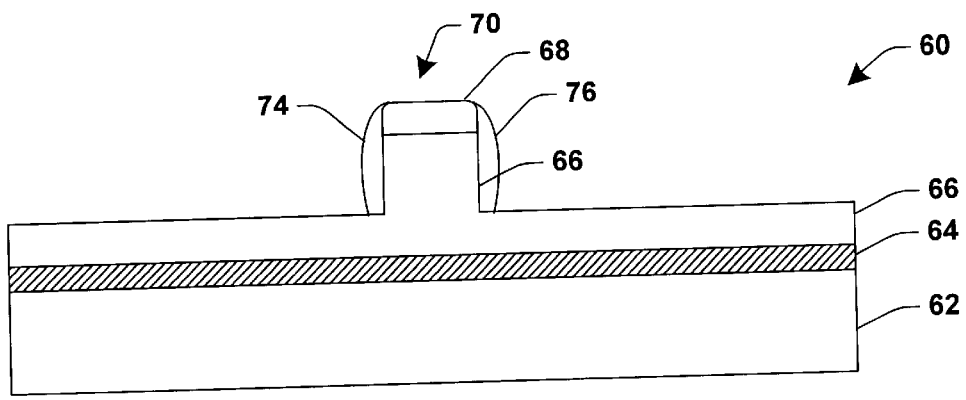
FIG. 8 is a schematic cross-sectional illustration of the structure of FIG. 7 after spacers have been formed on sidewalls of the gate structure in accordance with one aspect of the present invention.

After the etching step 90, a spacer formation step is employed. To accomplish this step, a spacer material layer 72 may be formed over the polysilicon layer 66 (FIG. 7). The spacer material layer 72 may be formed by growing an oxide layer over the polysilicon layer 66. Alternatively, the spacer material may be formed by depositing tetraethoxysilane (TEOS) oxide, silicon dioxide or the like over the surface of the polysilicon layer 66. The spacer material is then anisotropically etched to form the spacers 74 and 76 on the sidewalls of the gate structure 70, for example. In one aspect of the invention, the spacer material is etched employing a vertical plasma etch. An etchant which selectively etches the spacer material layer 72 (e.g., etches the spacer material layer at a faster rate than the polysilicon layer 66 and the ARC layer 68), may be used to etch the spacer material layer until only the spacers 74 and 76 remain at the sidewalls of the gate structure 70, as shown in FIG. 8.

Figure 9:
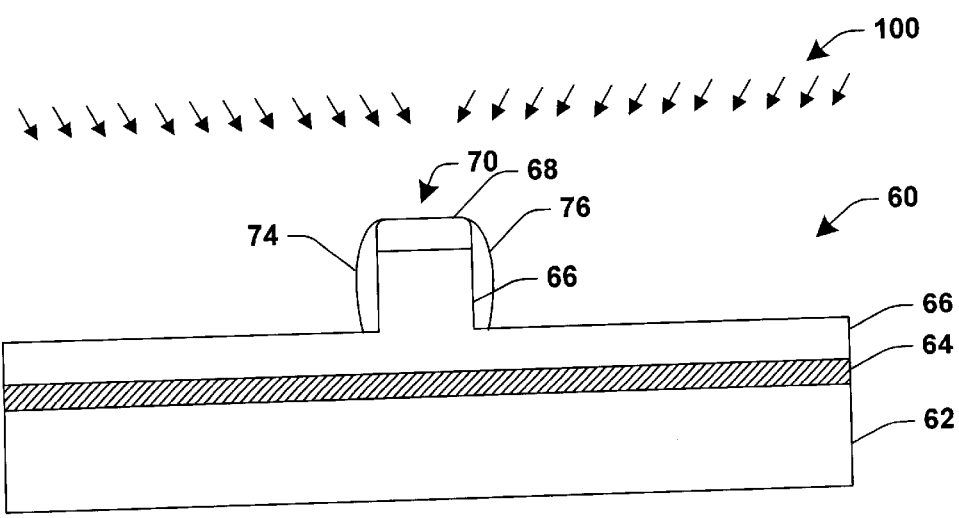
FIG. 9 is a schematic cross-sectional illustration of the structure of FIG. 8 undergoing an isotropic etching step in accordance with one aspect of the present invention.
Figure 10:
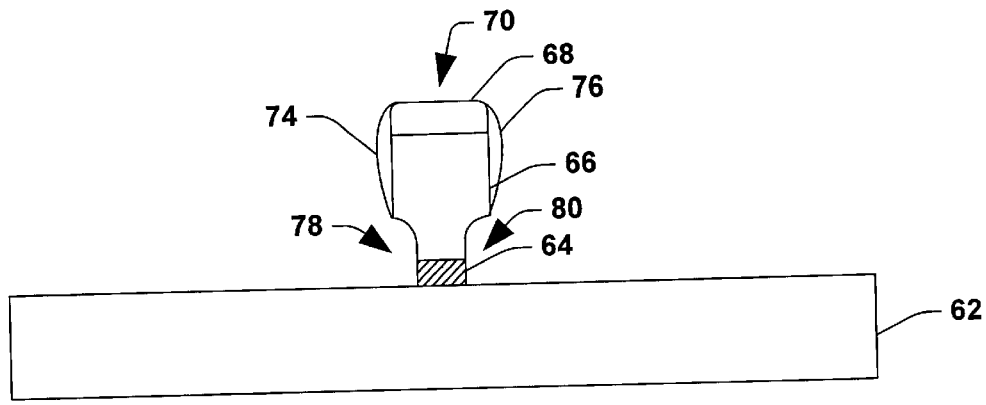
FIG. 10 is a schematic cross-sectional illustration of the structure of FIG. 9 after undergoing an isotropic etching step in accordance with one aspect of the present invention.

After the formation of the spacers 74 and 76 another etching step 100 is performed as illustrated in FIG. 9. The etching step 100 is an aggressive isotropic etching step to form undercut regions 78 and 80 (FIG. 10). A selective etch technique is used to etch the spacers 74 and 76, the polysilicon layer 66 and the gate oxide layer 64 over the underlying silicon layer 62. Any suitable etch technique may be employed to form the undercut regions 78 and 80. For, example the undercut regions 78 and 80 may be formed by employing reactive ion etching (RIE), standard plasma etching, magnetically enhanced RIE, reactive ion beam ion etching, microwave plasma etching or radical beam etching for the desired isotropic etching result. For example, etching step 100 may be employed utilizing an isotropic etch with a plasma gas(es) (e.g., oxygen plasma), herein carbon tetrafloride ($CF_4$) containing fluorine ions, in a commercially available etcher, such as a parallel plate RIE apparatus or, alternatively, an electron cyclotron resonance (ECR) plasma reactor to form undercut regions 78 and 80. In one aspect of the invention, the etching step 100 is etched using magnetic enhanced reactive ion etching (MERIE) or a high density plasma system using $Cl_2$ chemistry that will not substantially attack the underlying silicon layer. In another aspect of the invention, a MERIE method is used with reactant gases of $CL_2$ (30–100 sccm) and HBr (30–100 sccm) at a power level within the range of about 300–700 W, and pressure within the range of about 10–250 mT.

Figure 11:
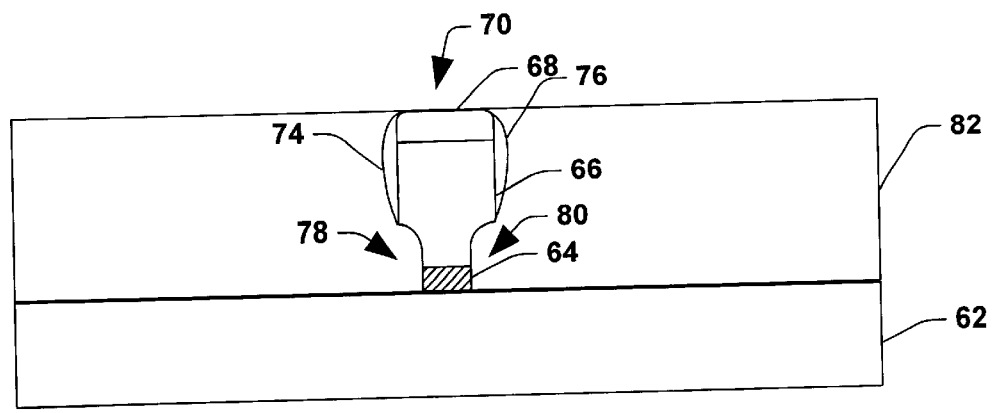
FIG. 11 is a schematic cross-sectional illustration of the structure of FIG. 10 after an oxide layer is deposited over the polysilicon layer in accordance with one aspect of the present invention.
Figure 12:
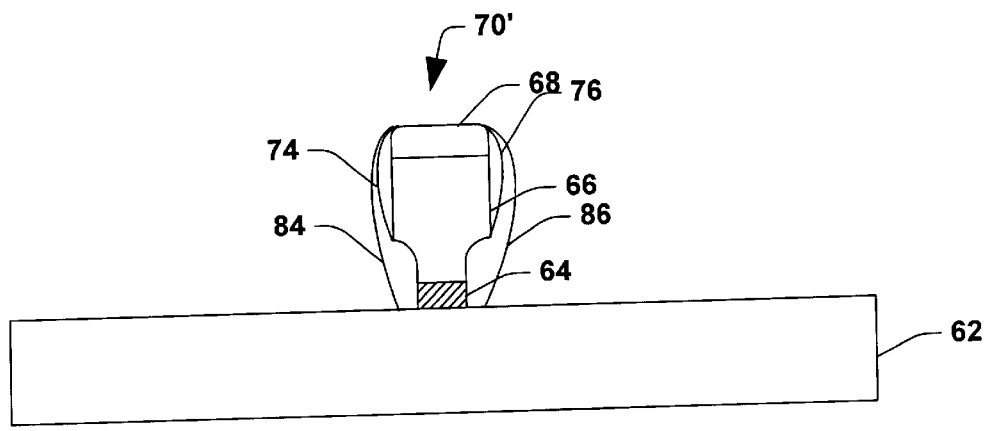
FIG. 12 is a schematic cross-sectional illustration of the structure of FIG. 11 after a second pair spacers have been formed on sidewalls of the gate structure in accordance with one aspect of the present invention.

After the etching step 100, a second spacer formation step is employed. To accomplish this step, a spacer material layer 82 may be formed over the polysilicon layer 66 (FIG. 11). The spacer material layer 82 may be formed by growing an oxide layer over the polysilicon layer 66. Alternatively, the spacer material may be formed by depositing tetraethoxysilane (TEOS) oxide, silicon dioxide or the like over the surface of the polysilicon layer 66. The spacer material is then anisotropically etched to form the spacers 84 and 86 on the sidewalls of the gate structure 70, for example. In one aspect of the invention, the spacer material is etched employing a vertical plasma etch. An etchant which selectively etches the spacer material layer 82 (e.g., etches the spacer material layer at a faster rate than the polysilicon layer 66 and the ARC layer 68), may be used to etch the spacer material layer 82 until only the spacers 84 and 86 remain at the sidewalls of the gate structure 70, as shown in FIG. 12. FIG. 12 illustrates a completed gate structure 70' in relevant part.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a T-gate structure comprising the steps of:
    providing a silicon layer having a gate oxide layer, a polysilicon layer over the gate oxide layer;
    forming a gate structure by removing portions of the polysilicon layer around a gate region; and
    forming undercut regions in the gate structure by performing an isotropic etch on the gate structure to provide the gate structure with a base region and a contact region, the base region having a width smaller than the contact region.

2. The method of claim 1, the isotropic etch removing the remaining portions of the polysilicon layer not part of the gate structure.

3. The method of claim 1, the isotropic etch being performed by one of a reactive ion etching, standard plasma etching, magnetically enhanced reactive ion etching, reactive ion beam ion etching, microwave plasma etching and radical beam etching.

4. The method of claim 1, the isotropic etch being performed by using a MERIE method with reactant gases of $CL_2$(30–100 sccm) and HBr(30–100 sccm) at a power level within the range of about 300–700 W, and pressure within the range of about 10–250 mT.

5. The method of claim 1, the step of providing a silicon layer having a gate oxide layer, a polysilicon layer over the gate oxide layer further comprising providing a antireflective coating layer over the polysilicon layer.

6. The method of claim 5, the antireflective coating layer being one of silicon oxynitride (SiON), silicon rich nitride (SiN) and titanium nitride (TiN).

7. The method of claim 5, the gate oxide layer, the polysilicon layer and the antireflective layer having a thickness within the range of about 500 Å to 3000 Å.

8. The method of claim 7, the gate oxide layer having a thickness within the range of about 10 Å to 1000 Å, the polysilicon layer having a thickness within the range of about 200 Å to 2500 Å and the antireflective layer having a thickness within the range of about 100 Å to 1500 Å.

9. The method of claim 1, further comprising the step of forming spacers on the sidewalls of the gate structure after the step of forming a gate structure and before the steps of forming the undercut regions.

10. The method of claim 9, the step of forming spacers on the sidewalls of the gate structure comprising a step of providing an oxide layer on the polysilicon layer and a step of etching the layer to form the spacers.

11. The method of claim 10, the step of etching the layer to form the spacers being a vertical plasma etch.

12. The method of claim 10, the step of providing the oxide layer on the polysilicon layer comprising growing the oxide layer over the polysilicon layer.

13. The method of claim 1, further comprising the step of forming spacers on the sidewalls of the gate structure after the step of forming the undercut regions.

14. The method of claim 13, the step of forming spacers on the sidewalls of the gate structure comprising a step of providing an oxide layer on the polysilicon layer and a step of etching the oxide layer to form the spacers.

15. The method of claim 14, the step of etching the oxide layer to form the spacers being a vertical plasma etch.

16. The method of claim 14, the step of providing the oxide layer on the polysilicon layer comprising growing the oxide layer over the polysilicon layer.

17. A method for fabricating a T-gate structure comprising the steps of:

providing a silicon layer having a gate oxide layer, a polysilicon layer over the gate oxide layer and an ARC layer over the polysilicon layer;

forming a gate structure by removing the ARC layer and portions of the polysilicon layer around a gate region;

forming spacers around the gate structure; and performing an isotropic etch to form undercut regions in the gate structure to provide the gate structure with a base region and a contact region, the base region having a width smaller than the contact region.

18. The method of claim 17, the isotropic etch being performed by using a MERIE method with reactant gases of $CL_2$(30–100 sccm) and HBr(30–100 sccm) at a power level within the range of about 300–700 W, and pressure within the range of about 10–250 mT.

19. A method for fabricating a T-gate structure comprising the steps of:

providing a silicon layer having a gate oxide layer, a polysilicon layer over the gate oxide layer and an ARC layer over the polysilicon layer;

forming a gate structure by removing the ARC layer and portions of the polysilicon layer around a gate region;

forming a first pair of spacers around the gate structure;

performing an isotropic etch to form undercut regions in the gate structure to provide the gate structure with a base region and a contact region, the base region having a width smaller than the contact region, the isotropic etch being performed by using a MERIE method with reactant gases of $CL_2$(30–100 sccm) and HBr(30–100 sccm) at a power level within the range of about 300–700 W, and pressure within the range of about 10–250 mT; and forming a second pair of spacers around the gate structure.

* * * * *